United States Patent [19]

Vicich et al.

[11] Patent Number: 5,960,537
[45] Date of Patent: Oct. 5, 1999

[54] FASTENER FOR AN ELECTRICAL CONNECTOR

[75] Inventors: Brian R. Vicich; John K. Hynes, both of Louisville, Ky.

[73] Assignee: Samtec, Inc., New Albany, Ind.

[21] Appl. No.: 09/017,074

[22] Filed: Feb. 2, 1998

[51] Int. Cl.$^6$ .................................................. H01R 9/00
[52] U.S. Cl. ............................... 29/843; 29/842; 29/845; 439/876
[58] Field of Search ....................... 439/83, 876; 29/842, 29/843, 845

[56] References Cited

U.S. PATENT DOCUMENTS

| | | | |
|---|---|---|---|
| 2,902,629 | 9/1959 | Little et al. | 439/55 |
| 2,965,812 | 12/1960 | Bedford, Jr. | 439/83 |
| 3,670,409 | 6/1972 | Reimer | 439/55 |
| 4,883,435 | 11/1989 | Seidler | 439/83 |
| 5,076,796 | 12/1991 | Kusayanagi et al. | 439/876 |
| 5,197,891 | 3/1993 | Tanigawa et al. | 439/83 |
| 5,249,975 | 10/1993 | Bladerschneider et al. | 439/876 |

*Primary Examiner*—Steven L. Stephan
*Assistant Examiner*—J. F. Duverne
*Attorney, Agent, or Firm*—Woodard, Emhardt, Naughton Moriarty & McNett Patent and Trademark Attorneys

[57] ABSTRACT

A fastener for an electrical connector. The fastener (10) includes a fastener body (12) having an opening (16) therethrough for receiving a pin (21). The fastener body (12) includes a plurality of gripping elements (14) protruding into the hole (16) for securing the fastener (10) to the pin (21) when disposed therebetween. The fastener (10) is then soldered to the pin (21) and to a mounting surface (34), such as a printed circuit board, by known soldering techniques.

6 Claims, 1 Drawing Sheet

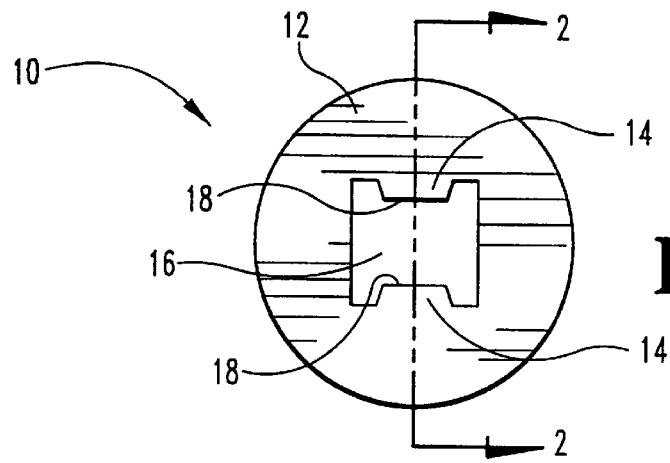
Fig. 1
Fig. 2
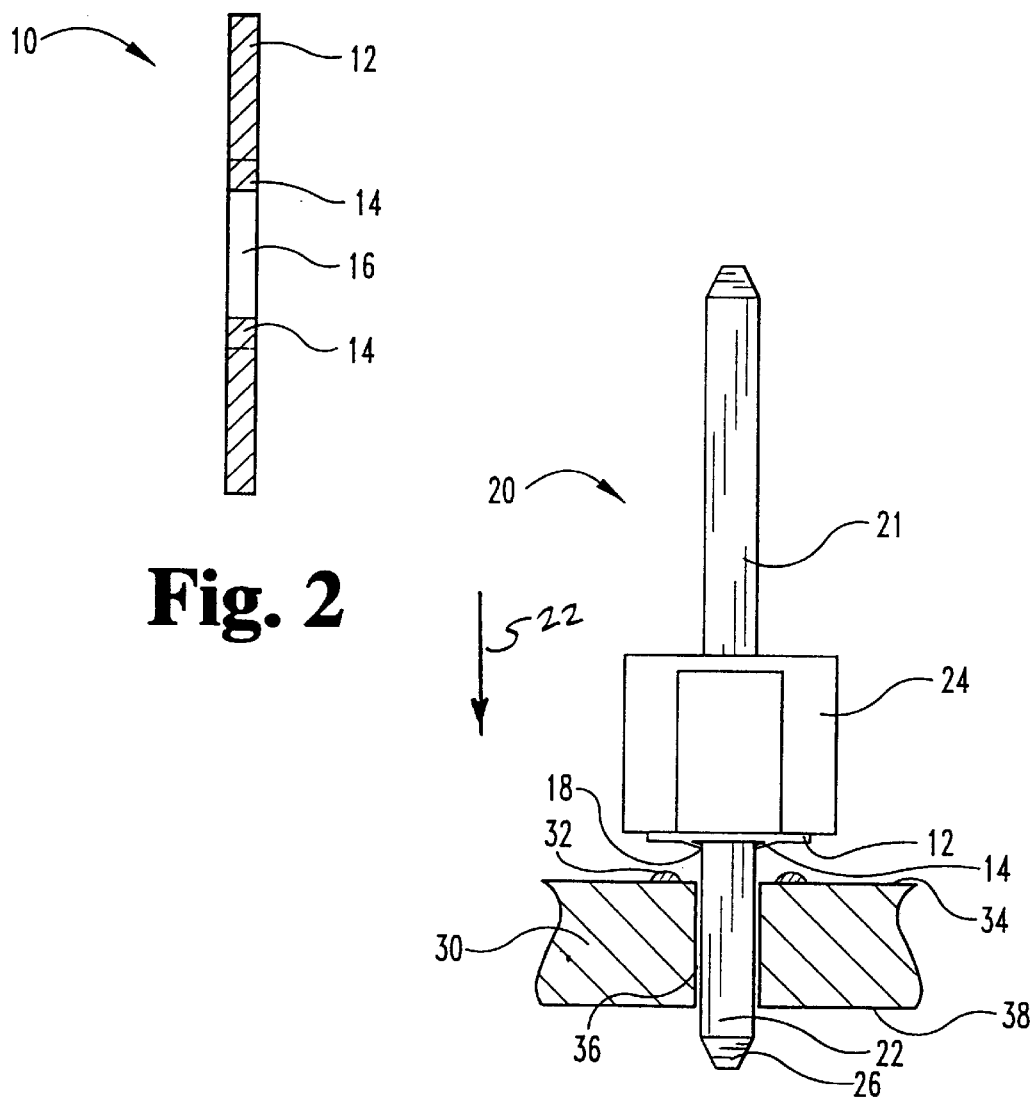
Fig. 3

FASTENER FOR AN ELECTRICAL CONNECTOR

TECHNICAL FIELD OF THE INVENTION

The present invention relates generally to electrical connectors, and more specifically to a fastener for electrical connectors.

BACKGROUND OF THE INVENTION

Electrical connectors are commonly used in the electronics industry in order to facilitate the interconnecton of various components. Such connectors are typically formed as a row of a specified number of positions, with each position containing one or more connection sites. For example, a twelve position dual in-line connector will have twelve positions of two pins each, for a total of 24 pins or connection sites.

Electrical connectors may generally be divided into two classes: through-hole connectors and surface mount connectors. When a through-hole connector is mounted onto a printed circuit board, each of the connector pins extends through a respective through-hole in the printed circuit board. In contrast, a surface mount connector is contained entirely on one side of the circuit board. The present invention relates primarily to through-hole connectors.

Through-hole connectors include conductive pins which protrude from their bottom surfaces and extend through holes formed in a printed circuit board when the connector is mounted thereon. Each of the pins must be soldered to a conductive trace on either the same or opposite sides of the printed circuit board from the connector body. For example, if a through-hole connector has 24 pins, 24 holes will be formed in the printed circuit board with the same dimensional spacing and size as the connector pins.

One of the problems commonly associated with through-hole connectors involves the soldering of the connector to the circuit board. There are currently 3 different techniques used in the connector industry to solder a connector to a board: 1) wave soldering; 2) solder preforms; and 3) hand soldering. Each of these techniques suffer from the following described drawbacks, which are significant as known to those of ordinary skill in the art.

Wave soldering involves the submersion of the tail of the connector pin (that portion of the pin extending through the through-hole) and the mounting surface (the surface to which the tail is soldered) in an actual wave of hot, liquid solder. The liquid solder is contain in a bath or tub, and the wave is created by ultrasonic means as known in the art. The solder coats the tail and the mounting surface, causing the pin to be fastened to the mounting surface when the solder hardens.

One problem associated with wave soldering is that the solder covers all the parts in which it contacts. This results in the waste of solder material and increases the cost of soldering through-hole connectors. A second problem is that solder covers the tails that extend through the through-holes. This is particularly troublesome in applications in which long tails are extended through the through-holes in order to engage a second printed circuit board. The solder that clings to the long tails increases the cross-sectional area of that portion of the pin. This condition causes the pin to not fit through the holes of the second board. Thus, the solder must be removed from the tails, which is an expensive and time-consuming process.

Solder preforms are one attempt to address the problems associated with wave soldering. Solder preforms are essentially rings of solder paste that are press-fit onto the connector pin. The pin is then inserted into the through-hole until the preform is in contact with the connector body and the circuit board. The assembly is placed in an infrared oven to reflow the solder paste and solder the connector to the circuit board.

One of the problems associated with solder preforms is the cost of the preform. It is very expensive to preform the solder paste in a manner that allows it to be press-fit on a connector pin. A second problem is that solder preforms are not reliable. They tend to fall off the pin before it is inserted into the through-hole. A poor solder connection may result when this problem is not detected. Given the high quality standards required in the connector industry, this is an unacceptable result.

A final method of soldering pin connectors to circuit boards is to use hand soldering techniques. Hand soldering, while reliable, is expensive. It is also impracticable, if not impossible, to solder connectors including multiple rows of pins to a circuit board. For example, a connector with four rows of pins is common in the connector industry. It is impossible for a reliable solder connection to be obtained in the interior rows due to the limited amount of space between rows, which may be less than one millimeter for some types of connectors.

What is therefore needed is a technique for soldering through-hole connectors that addresses the foregoing shortcomings in the prior art. The technique should be clean, inexpensive and minimize the use of solder material. It should be reliable, yet adaptable for use in many different types of pin connector designs. Finally, the technique should be readily integratable into existing soldering methods and apparatus. The present invention is directed toward meeting each of these needs.

SUMMARY OF THE INVENTION

The present invention relates to fasteners for through-hole electrical connectors. The connector pins are typically inserted through through-holes in a circuit board or other mounting surface. What is disclosed is a fastener with a fastener body defining a hole and including a plurality of gripping elements disposed within the hole. The gripping elements secure the fastener body to the pin. A fastening means is then employed to fasten the fastener body to the pin and to the mounting surface.

In one form of the invention, the fastening means includes a solder paste screened around the through-hole. The assembly may then placed in an infrared or vapor phase oven to reflow the solder paste, engaging the fastener to the pin and to the mounting surface.

In another form of the invention, a method of fastening a connector pin to a mounting surface defining a through-hole is disclosed, comprising the steps of: (a) providing a fastener having a fastener body defining an opening, the fastener body further including gripping elements disposed within the opening for securing the fastener body to the pin; (b) inserting the pin through the fastener; (c) providing a quantity of solder paste; (d) placing the solder paste around the through-hole; (e) inserting the pin into the through-hole until the fastener contacts the solder paste; and (f) reflowing the solder paste to engage the fastener to the pin and to the mounting surface.

In yet another form of the invention, a fastener to facilitate fastening a connector pin to a mounting surface is disclosed. The fastener includes a fastener body, an opening defined by the fastener body, and at least one gripping element having a gripping surface adapted to contact the pin and prevent movement of the pin with respect to the fastener body in at least one direction.

It is one object of the present invention to provide a technique for engaging a pin connector to a mounting surface in an inexpensive and efficient manner.

It is another object of the present invention to provide a reliable solder connection between a pin connector and a mounting surface.

A further object of the present invention is to provide a technique for engaging a pin connector to a mounting surface that is readily integratable into existing soldering methods and technologies.

These and other objects of the present invention will be more apparent from the following description of the preferred embodiment.

BRIEF DESCRIPTION OF THE DRAWINGS

FIG. 1 is a top plan view of a preferred embodiment fastener of the present invention.

FIG. 2 is a section view along line 2—2 of the preferred embodiment fastener in FIG. 1.

FIG. 3 is a side elevational view of one specific application of the preferred embodiment fastener of FIG. 1.

DESCRIPTION OF THE PREFERRED EMBODIMENT

For the purposes of promoting an understanding of the principles of the invention, reference will now be made to the embodiment illustrated in the drawings and specific language will be used to describe the same. It will nevertheless be understood that no limitation of the scope of the invention is thereby intended, such alterations and further modifications in the illustrated device, and such further applications of the principles of the invention as illustrated therein being contemplated as would normally occur to one skilled in the art to which the invention relates.

A first embodiment of the present invention is illustrated in a top plan view of FIG. 1, and is indicated generally at 10. The fastener 10 includes a fastener body 12. The fastener body 12 defines an opening 16 therethrough. Fastener body 12 additionally includes a plurality of gripping elements 14, which form protrusions into opening 16. In the preferred embodiment, there are two gripping elements 14. Other alternate embodiments contemplate lesser or greater numbers of gripping elements 14, so long as opening 16 allows a pin 21 to pass therethrough.

Referring now to FIG. 2, a section of fastener 10 through line 2—2 of FIG. 1 is illustrated. In FIG. 2, gripping elements 14 are shown to lie in the same plane as fastener body 12. Alternate embodiments contemplate that gripping elements 14 are biased in the direction of pin insertion in order to facilitate passage therethrough. In any event, fastener body 12 and gripping elements 14 are preferably made from a strong resilient metal that will deform to allow passage of pin 21 through opening 16, yet secure fastener 10 to pin 21 once fastener 10 is in place. In one embodiment, the fastener 10 is made from brass However, any other material for fastener 10 is also contemplated as would occur to those of ordinary skill in the art.

Referring now to FIG. 3, one specific application utilizing the present invention is illustrated. The pin 21 is typically a part of an electrical connector assembly, designated in FIG. 3 generally at 20. It should be understood that connector assembly 20 may include any known body type or configuration as is known to those of ordinary skill in the art. All that is required for the present invention is for the connector assembly 20 to include the pin 21 projecting outward from at least one side.

Pin 21 is made from any electrically conductive material such as copper, as is known in the art. Additionally, pin 21 defines a cross-section which may either be square or circular. The hole 16 is sized to allow passage of pin 21 as illustrated. Typically, pin 21 includes at least one tapered end portion 26 to facilitate passage of pin 21 through various openings and through holes in connector body 24, or through a through-hole 36 in mounting body 30. Mounting body 30 typically is a printed circuit board. However, mounting body 30 may also include any object to which connector assembly 20 is mounted as known to those of ordinary skill in the art.

In order to secure fastener 10 to pin 21, gripping elements 14 deflect in the direction of insertion to allow passage of pin 21 therebetween. To ensure that gripping elements 14 remain secured to pin 21, it is necessary that the space between the gripping elements 14 be less than the dimensions of the cross-section of pin 21. As can be seen from illustration in FIG. 3, the downward deflecting gripping elements 14 prevent pin 21 from being pulled out of fastener 10 due to the resistance provided by engagement surfaces 18. The engagement surfaces 18 tend to frictionally engage, or grab, the exterior of pin 21 if it is pulled opposite the direction of insertion, indicated by arrow 22. Thus, pin 21 is prevented from moving relative to fastener 10 in a direction opposite the direction of insertion 22 by engagement surfaces 18 of gripping elements 14, and in the direction of insertion 22 by interference between connector body 24 and fastener 10.

Another requirement of fastener 10 is that it withstand the various soldering temperatures used to connect the connector body 24 to the mounting body 30. In the preferred embodiment, a solder paste 32 is used as is known in the art. The solder paste 32 is disposed around through-hole 36 on mounting surface 34. To engage connector 24 to mounting body 30, fastener 10 is placed on pin 21 and disposed between connector body 24 and mounting surface 30. Pin 21 is inserted into through-hole 36 until fastener 10 and solder paste 32 are in contact. The assembly 20 is then placed in a vapor phase oven, an infrared oven, or other equivalent device known to those of ordinary skill in the art, to reflow solder the fastener 10 to mounting body 30 and to pin 21.

In other applications of the present invention, through-hole 16 may be plated with any metal material such as would occur to those of ordinary skill in the art, and the plating may be extended to form an annular ring around through-hole 36. Solder paste 32 is then placed on this metal plating, and the assembly 20 soldered as described above.

Another application of the present invention contemplates the insertion of fastener 10 over tail portion 22 until it contacts solder paste placed on a bottom surface 38 of mounting body 30. The pin 21 is then soldered to mounting body 30 as described above. The fastener 10 is prevented from moving relative to pin 21 in a direction opposite the direction of insertion 22 by engagement surfaces 18 of gripping elements 14, and in the direction of insertion 22 by interference between bottom surface 38 of mounting body 30 and fastener 10.

While the invention has been illustrated and described in detail in the drawings and foregoing description, the same is to be considered as illustrative and not restrictive in character, it being understood that only the preferred embodiment has been shown and described and that all changes and modifications that come within the spirit of the invention are desired to be protected.

What is claimed is:

1. A method for fastening a connector having a connector body and a pin to a mounting surface defining a through-hole comprising the steps of:
   (a) providing a fastener, the fastener including a fastener body having an opening, the fastener body including a plurality of gripping elements for securing the fastener body to the pin;
   (b) inserting the pin through the fastener;
   (c) providing a quantity of solder paste;
   (d) placing the solder paste on the mounting surface around the through-hole;
   (e) inserting the pin with the fastener into the through-hole until the solder paste contacts the fastener, such that the fastener is positioned between the solder paste and the connector body; and
   (f) reflowing the solder paste in order to couple the fastener to the mounting surface and to the pin.

2. The method of claim 1, wherein the plurality of gripping elements of step (a) includes two gripping elements.

3. The method of claim 1, wherein reflowing the solder paste of step (f) includes placing the pin and the mounting surface in an oven.

4. The method of claim 3, wherein the oven includes a vapor phase oven.

5. The method of claim 3, wherein the oven includes an infrared oven.

6. The method of claim 3, wherein the oven includes an infrared convection oven.

* * * * *

UNITED STATES PATENT AND TRADEMARK OFFICE
CERTIFICATE OF CORRECTION

PATENT NO : 5,960,537
DATED : October 5, 1999
INVENTOR(S) : Brian R. Vicich et al.

It is certified that error appears in the above-identified patent and that said Letters Patent is hereby corrected as shown below:

In column 3, line 60, please insert --.-- after "brass".

Signed and Sealed this

Nineteenth Day of September, 2000

Attest:

Q. TODD DICKINSON

*Attesting Officer*       *Director of Patents and Trademarks*